(12) United States Patent
Dietz et al.

(10) Patent No.: US 11,294,007 B2
(45) Date of Patent: Apr. 5, 2022

(54) MAGNETIC RESONANCE DEVICE AND METHOD FOR RECORDING MAGNETIC RESONANCE DATA USING A MAGNETIC RESONANCE DEVICE

(71) Applicant: Siemens Healthcare GmbH, Erlangen (DE)

(72) Inventors: Peter Dietz, Fuerth (DE); Andrew Dewdney, Neunkirchen am Brand (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/775,865

(22) Filed: Jan. 29, 2020

(65) Prior Publication Data

US 2020/0241093 A1 Jul. 30, 2020

(30) Foreign Application Priority Data

Jan. 29, 2019 (EP) ..................... 19154206

(51) Int. Cl.
*G01V 3/00* (2006.01)
*G01R 33/385* (2006.01)
*G01R 33/48* (2006.01)
*G01R 33/561* (2006.01)

(52) U.S. Cl.
CPC ..... *G01R 33/3852* (2013.01); *G01R 33/3856* (2013.01); *G01R 33/3858* (2013.01); *G01R 33/482* (2013.01); *G01R 33/5611* (2013.01)

(58) Field of Classification Search
CPC .............. G01R 33/543; G01R 33/5659; G01R 33/3415; G01R 33/36; A61B 5/055

USPC ......................................................... 324/309
See application file for complete search history.

(56) References Cited

U.S. PATENT DOCUMENTS

| | | | |
|---|---|---|---|
| 7,990,143 B2* | 8/2011 | Aubert | G01R 33/385 324/318 |
| 2002/0008518 A1* | 1/2002 | Arz | G01R 33/28 324/322 |
| 2006/0082370 A1* | 4/2006 | Cirel | G01R 33/3856 324/318 |
| 2006/0279285 A1* | 12/2006 | Morita | G01R 33/3856 324/318 |
| 2010/0007347 A1* | 1/2010 | Ham | G01R 33/385 324/318 |
| 2010/0060281 A1* | 3/2010 | Doyle | G01R 33/3415 324/318 |

(Continued)

OTHER PUBLICATIONS

Henning, Juergen et al., "Parallel imaging in non-bijective, curvilinear magnetic field gradients: a concept study", Magnetic Resonance Materials in Physics, Biology and Medicine, vol. 21, pp. 5-14, 2008 // DOI: 10.1007/s10334-008-0105-7.

(Continued)

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

A magnetic resonance device (1), having a main magnet unit (2) with a cylindrical patient aperture (3), wherein at least one radial gradient coil (9) is provided in the patient aperture (3) which generates a gradient field having, at least in regions, a radial gradient in relation to its own central axis parallel to the longitudinal axis of the patient aperture (3), the radial gradient coil (9) being embodied as a cylinder coil.

21 Claims, 3 Drawing Sheets

(56) References Cited

U.S. PATENT DOCUMENTS

| | | | |
|---|---|---|---|
| 2010/0060282 A1* | 3/2010 | Shvartsman | G01R 33/385 324/318 |
| 2013/0181713 A1* | 7/2013 | Eberlein | G01R 33/3852 324/314 |
| 2013/0241558 A1* | 9/2013 | Schuster | G01R 33/3403 324/322 |
| 2016/0334479 A1* | 11/2016 | Poole | A61B 5/7203 |
| 2017/0248670 A1* | 8/2017 | Giri | G01R 33/4835 |
| 2017/0270695 A1* | 9/2017 | Avinash | A61B 6/481 |

OTHER PUBLICATIONS

Lee, S. Y. et al., "Localized Volume Selection Technique Using an Additional Radial Gradient Coil", Magnetic Resonance in Medicine, vol. 12, No. 1, pp. 56-63, Oct. 1989 // https://doi.org/10.1002/mrm.1910120107.

Lee, D. H. et al., "MRI in cylindrical coordinates", Elsevier, Magnetic Resonance Imaging, vol. 12, No. 4, pp. 613-620, Jan. 1, 1994 // ISSN: 0730-725X; https://doi.org/10.1016/0730-725X(94)92456-2.

Wang, Haifeng et al., "Fast Rotary Nonlinear Spatial Acquisition (FRONSAC) Imaging", Magnetic Resonance Medicine, vol. 75, Nr. 3, pp. 1154-1165, 2016 // DOI: 10.1002/mrm.25703.

Stockmann, Jason P. et al., "O-Space Imaging: Highly Efficient Parallel Imaging Using Second-Order Nonlinear Fields as Encoding Gradients with no Phase Encoding", Magnetic Resonance in Medicine, vol. 64, pp. 447-456, 2010 // DOI 10.1002/mrm.22425.

European Search Report dated Jul. 29, 2019 for Application No. 19154206.7.

* cited by examiner

MAGNETIC RESONANCE DEVICE AND METHOD FOR RECORDING MAGNETIC RESONANCE DATA USING A MAGNETIC RESONANCE DEVICE

CROSS REFERENCE TO RELATED APPLICATIONS

This patent application claims priority to European Patent Application No. 19154206.7, filed Jan. 29, 2019, which is incorporated herein by reference in its entirety.

BACKGROUND

Field

The disclosure relates to a magnetic resonance device, having a main magnet unit with a cylindrical patient aperture. The disclosure further relates to a method for recording magnetic resonance data using such a magnetic resonance device.

Related Art

Magnetic resonance imaging has become an established tool, in particular in the medical sector, when magnetic resonance images of a patient are to be recorded. In this context, magnetic resonance devices conventionally have a main magnet unit, which contains the basic field magnet and has a patient aperture ("bore"), into which the patient can be moved, in particular by means of a patient couch. Situated within the patient aperture is the field of view of the magnetic resonance device, i.e. the homogeneity volume in which the homogeneity of the basic magnetic field is good enough to be able to operate imaging in a useful manner. Here, the central region of said field of view/homogeneity volume is often also referred to as the isocenter of the magnetic resonance device, which extends about the center of the patient aperture.

For spatial encoding of the magnetic resonance imaging, the basic magnetic field is superimposed with gradient fields which are generated by gradient coils. In this context, known magnetic resonance devices use a gradient coil arrangement, which for example may be arranged inside the patient aperture, surrounding it, and which has gradient coils for various directions of a Cartesian coordinate system, conventionally for the Z direction as the longitudinal direction of the cylindrical patient aperture or the direction in which the basic magnetic field is oriented, the X direction as the horizontal direction perpendicular thereto and the Y direction as the vertical direction perpendicular thereto. These gradient coils generate linear gradients here.

In recent years, approaches have increasingly been proposed for also using non-linear or local gradient fields, which has become known under the key words of "PAT-LOC—Parallel Imaging Technique Using Localized Gradients" or "FRONSAC—Fast Rotary Nonlinear Spatial Acquisition." Reference is made, purely by way of example, to the article by Jurgen Hennig et al. "Parallel imaging in non-bijective, curvilinear magnetic field gradients: a concept study," Magn Reson Mater Phy 21 (2008), pages 5-14, and the article by Haifeng Wang et al. "Fast Rotary Nonlinear Spatial Acquisition (FRONSAC) Imaging," Magn Reson Med 75 (2016), 1154-1165.

In this context, these gradient variants have primarily been proposed in the context of parallel imaging (PAT—Parallel Acquisition Technique), i.e. with the use of radio-frequency coil arrangements, which have radio-frequency coil elements which can be operated or actuated independently for transmitting and/or receiving. When using non-linear and/or local gradients, an acceleration and/or improvement of the magnetic resonance imaging should be enabled by the imaging being parallelized in various areas.

For the realization of such non-linear gradient fields, it has been proposed in the prior art to use field distributions in the form of second-order spherical harmonics, for example gradient fields in the form of the A20 field portion. Second-order field portions of this kind are also used in the prior art with regard to shim coils, wherein shim coils for various field portions (A20, A21, A22, B21, B22, . . . ) may be cited by way of example. Using shim coils of this kind, corresponding portions of interference fields can be compensated by way of example.

Second-order field distributions, in particular according to second-order spherical harmonics, may simply be able to be implemented by local gradient coils, but have the disadvantage that only low gradients can be anticipated in the region of the isocenter, i.e. close to the gradient coil arranged adjacent to a radio-frequency coil element by way of example, due to the polynomial sequence, so that in the example described no spatial resolution, or only an inadequate spatial resolution, is possible in the region in which the radio-frequency coil elements are most sensitive, due to the gradient fields. In other words, points in the center of the field of view may arise in which a spatial resolution is not possible, or is not possible to a sufficient extent.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
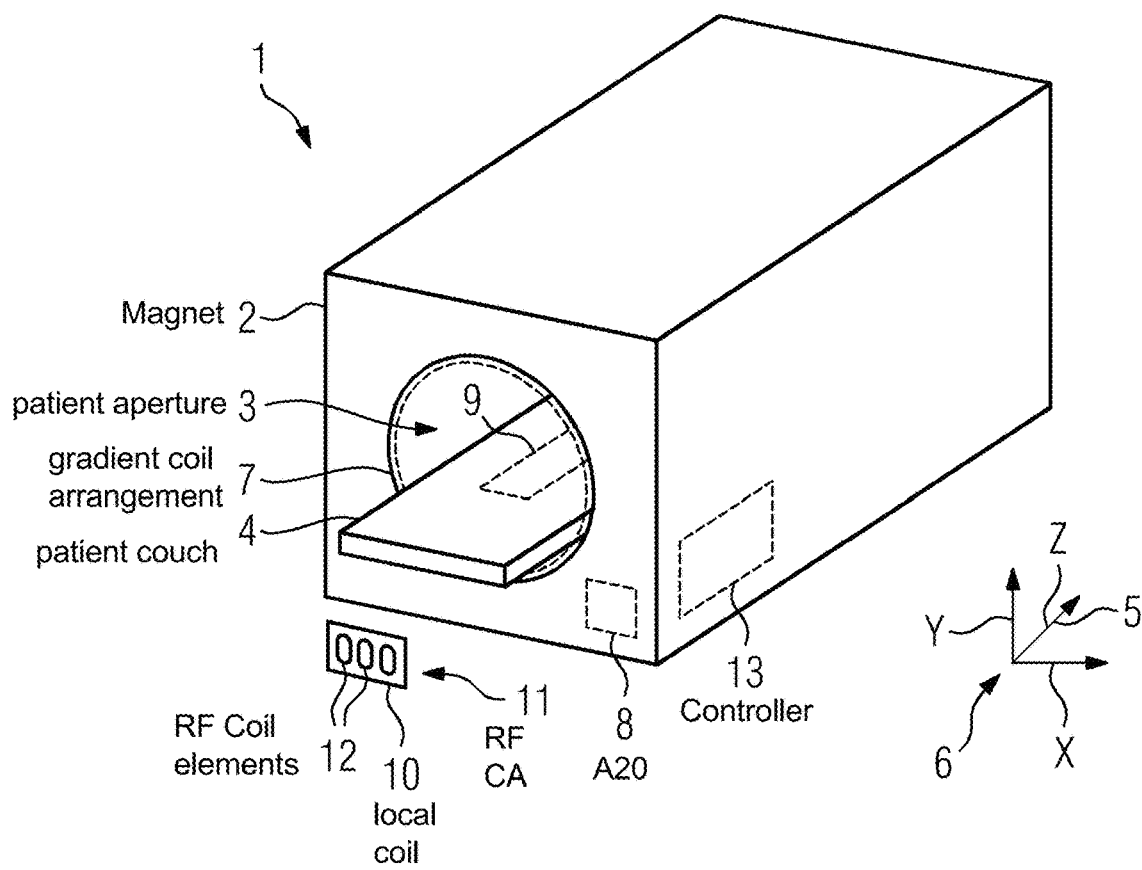
FIG. 1 illustrates a magnetic resonance device according to an exemplary embodiment of the present disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the disclosure is to disclose an improved option for generating a non-linear gradient field to be used when recording magnetic resonance data, in particular which is intuitively appropriate for the geometry in the magnetic resonance imaging and/or a patient to be recorded and which is simple to implement.

A magnetic resonance device according to exemplary embodiments of the disclosure, having a main magnet unit with a cylindrical patient aperture, has at least one radial gradient coil in the patient aperture which generates a gradient field having, at least in regions, a radial gradient in relation to its own central axis parallel to the longitudinal axis of the patient aperture, the radial gradient coil being embodied as a cylinder coil.

The present disclosure thus relates to magnetic resonance devices with a cylindrical patient aperture embodied in a main magnet unit. The main magnet unit contains the basic field magnet, which is usually superconductive, the basic magnetic field thereof being oriented along the longitudinal direction (Z direction) of the cylindrical patient aperture.

In an exemplary embodiment, a radial gradient coil is used, which generates a gradient field with a radial gradient. To this end, the radial gradient coil is expediently embodied as a cylinder coil and is aligned with its central axis parallel to the patient aperture. A field distribution having a radial gradient cannot be allocated to a single term of the spherical harmonics usually used for field distribution, but it does have interesting properties. It should first be noted that the radial direction is a base direction of a cylindrical or spherical coordinate system. The patient aperture is also conventionally embodied in a cylindrical manner. A further, considerable advantage of a radially running gradient is that the stronger field differences, thus a stronger gradient, are in particular present close to the radial gradient coil, thus in the region of the isocenter of the magnetic resonance device.

In an exemplary embodiment, a radial progression of a gradient can be realized by a cylinder coil, the central axis of which corresponds to the longitudinal axis of the patient aperture or runs in parallel thereto. Outside of the winding cross-section of the cylinder coil, which may be relatively small, the generated gradient field will then decrease as a function of the distance from the radial gradient coil and thus generate an at least approximately radial field distribution.

To summarize, a radial gradient coil generating a radial or approximately radial field distribution as an "additional gradient" is suitable as an alternative or in addition to further gradient coils for improving the parallelization of the magnetic resonance data recording, as the space in the isocenter, i.e. the center of the field of view, which in previous approaches is free from strong gradients, is filled with strong gradients. In addition, with a central placement in relation to a patient, it is the case that the field characteristic of the gradient field of the radial gradient coil correlates well with that of the body. This is because a patient has somewhat approximately cylindrical shapes as "Cartesian" shapes, meaning that a field distribution is realized which is appropriate for the body shape. This gives an excellent basis for corresponding future applications.

The windings of the radial gradient coil consist of copper for example. Expediently, the winding radius of the radial gradient coil may lie in a range of from 1 cm to 10 cm, for example at 5 cm, and/or the radial gradient coil may extend in the longitudinal direction along at least the length of the field of view of the magnetic resonance device, in particular at a length of at least 50 cm. Since the line, which in particular consists of copper and is shaped to form the windings for the radial gradient coil, has to be able to carry the gradient current necessary for generating sufficiently strong gradient fields, the inner radii are restricted depending on the design. A winding radius in the range of from 2.5 cm to 5 cm has proven to be a suitable size, for example, as the necessary space within the patient aperture is also then available for a cylinder coil of a corresponding diameter with certainty. The radial gradient coil may preferably be longer in the longitudinal direction than the length of the field of view of the magnetic resonance device, as then movements of the radial gradient coil within the patient aperture, for example together with the patient couch, do not also lead to the radial gradient coil being (completely) removed from the field of view of the magnetic resonance device, thus out of the homogeneity volume. It may be provided, for example, that the radial gradient coil extends at least over half of the length of the patient aperture.

In an exemplary embodiment, the central axis of the radial gradient coil may correspond to the longitudinal axis of the patient aperture. This embodiment is in particular able to be implemented in an advantageous manner when there is a large patient aperture, thus having a large diameter, meaning that a patient couch can be placed centrally for example and thus the radial gradient coil may be integrated into the patient couch or may lie precisely on the longitudinal axis of the patient aperture, arranged on, in or below said patient couch. An arrangement principle corresponding to a cylindrical coordinate system of the patient aperture with regard to the radius is then substantially directly realized by the radial gradient.

Particularly, if the diameter of the patient aperture is rather small, then in the context of the present disclosure it is also conceivable in a second alternative, however, for the central axis of the radial gradient coil to be displaced in relation to the longitudinal axis of the patient aperture, in particular in the vertical direction. In this embodiment, the cylinder coil is thus in particular positioned lower than the longitudinal axis of the patient aperture, so that the generated gradient fields are no longer solely dependent upon the radius position within the patient aperture, but rather upon both the radius and the peripheral position. The gradient field thus also has a known and well-defined peripheral component, which is to be taken into consideration accordingly in the image reconstruction. This is unproblematic, however, as processing variants for considerably more complex gradient field distributions have already been proposed in the prior art.

In an exemplary embodiment, in addition to the radial gradient coil, an A20 gradient coil and/or a gradient coil arrangement including gradient coils for directions of a Cartesian coordinate system is/are provided as part of the magnetic resonance device. In an exemplary embodiment, a controller of the magnetic resonance device is embodied for supplementary use of the radial gradient coil and the A20 gradient coil and/or the gradient coil arrangement, in particular to realize a spatial encoding.

In an exemplary embodiment, a gradient running in an at least approximately radial manner can be particularly advantageously supplemented with an A20 field distribution, as the A20 field distribution has constant values in the plane perpendicular to the longitudinal direction of the patient aperture (X-Y plane) and varies in the longitudinal direction, while a radial field distribution behaves precisely in the inverse manner: constant in the longitudinal direction of the patient aperture and varying strongly with distance from the longitudinal axis of the patient aperture. It is thus possible for known and well-defined gradient fields covering different encoding directions to be generated with the aid of the radial gradient coil and the A20 gradient coil. In an exemplary embodiment, a corresponding spatial position can be assigned from the known field progression in the controller of the magnetic resonance device, possibly while additionally observing a recording radio-frequency coil element of a radio-frequency coil arrangement, so that a spatial encoding is given.

In conjunction with a "Cartesian" gradient coil arrangement which is conventionally used nowadays, i.e. one which has gradient coils for the X, Y and Z direction, the latter corresponding to the longitudinal direction of the patient aperture, it is particularly advantageously possible to implement a cylindrical coordinate system in which the radial gradient coil is operated together with the Z gradient coil of the gradient coil arrangement. A cylindrical coordinate system of this kind, in which the longitudinal direction of the patient aperture is covered by the gradient field of the Z gradient coil, and the radial direction by the radial gradient coil, is particularly suitable for imaging on patients which can be approximated to a cylindrical shape, for example in the torso region. It should be noted in particular that for many application cases of magnetic resonance imaging it has already been proposed to use local coils as a radio-frequency coil arrangement, the radio-frequency coil elements of which being arranged on the body surface surrounding the body part of the patient to be recorded accordingly, the arrangement of the radio-frequency coil elements themselves thus following an at least approximately cylindrical shape.

In an exemplary embodiment, the magnetic resonance device includes a patient couch which can be moved into the patient aperture. In an exemplary embodiment, the radial gradient coil is integrated into the patient couch or placed on or in the patient couch, in particular using a radial gradient coil receptacle, or is arranged below the patient couch. In this context, embodiments are also conceivable, in particular if the diameter of the patient aperture is sufficiently large that the patient couch can be placed centrally therein, so that it is particularly possible to place the radial gradient coil with its central axis on the longitudinal axis of the patient aperture. In an exemplary embodiment, a complete integration of the radial gradient coil into the patient couch may be provided here. It is also possible, however, to provide a radial gradient coil receptacle, which receives the radial gradient coil, possibly only when required. Particularly in the case of smaller patient apertures or problems relating to the extension of the patient couch, it may also be particularly expedient to arrange the radial gradient coil below the patient couch, thus vertically offset from the longitudinal axis of the patient aperture overall. The integration into or placement/fastening in, on or below the patient couch has the advantage that supply lines to the radial gradient coils can be realized combined together with other possibly provided supply lines to the patient couch. In an exemplary embodiment, it is also possible for a slot or the like for connecting the radial gradient coil to be realized in the patient couch, particularly in the case of a radial gradient coil which can be placed or fastened on, in or below the patient couch merely on a temporary basis.

Expediently, in an exemplary embodiment, the radial gradient coil is assigned at least one insulation means for thermal and/or electrical insulation with respect to a patient. For example, in the case of a radial gradient coil which can be placed on and/or in a patient couch, this may be surrounded by an electrical insulation means, which preferably also has a thermally insulating effect. When arranged below the patient couch, the patient couch itself also acts as an insulation means. In this way, it is possible to avoid electrical and thermal effects in relation to the patient, which may have a negative impact on said patient.

In this context, in an exemplary embodiment, an advantageous development of the present disclosure additionally provides that the radial gradient coil is assigned a cooler. While coolers of this kind may already be known in principle in the prior art, specific embodiments are suitable in the present case which enable as little interference in the imaging using the magnetic resonance device as possible due to the central arrangement (in or close to the field of view) of cooling ducts for the cooling medium. As magnetic resonance devices are usually aimed at detecting water, a first advantageous embodiment of the present disclosure makes provision in this respect for the cooler to be operated with a coolant not corresponding to water, in particular an oil. In this manner, it is possible to avoid interference arising due to the coolant, in particular due to recording magnetic resonance signals of the coolant. A further, particularly advantageous embodiment of the disclosure makes provision in this regard for the cooler to have at least one cooling duct for the coolant which runs within a coil conductor of the radial gradient coil. For example, the windings of the radial gradient coil thus may be embodied by a hollow coil conductor, for example in the form of a copper tube, in which the coolant, which in this case may also be water, circulates shielded from any imaging processes.

As already explained, the radial gradient coil is particularly used for accelerating and/or improving parallel imaging processes, so that the magnetic resonance device preferably may also have a radio-frequency coil arrangement embodied for parallel imaging. This thus has a plurality of radio-frequency coil elements, which are able to transmit and/or receive independently of one another, i.e. in parallel operation, in particular are therefore able to be actuated by the controller independently. In an exemplary embodiment, the aforementioned controller may thus be configured for parallel imaging using the magnetic resonance device with the use of the radio-frequency coil arrangement and at least the radial gradient coil for spatial encoding.

In an exemplary embodiment, the magnetic resonance device also relates to a method for recording magnetic resonance data using a magnetic resonance device according to the disclosure. In an exemplary embodiment, the magnetic resonance device is controlled by a controller, which can be configured to perform a parallel imaging technique with a radio-frequency coil arrangement with a plurality of radio-frequency coil elements and at least the radial gradient coil is used to generate gradient fields to be used for spatial encoding of received magnetic resonance signals of at least one radio-frequency coil element. All statements relating to the inventive magnetic resonance device can be applied analogously to the inventive method, and therefore the advantages already described can thus be obtained by said method.

In particular, there thus may also be provision as part of the method according to the disclosure, in addition to the radial gradient coil, for an A20 gradient coil and/or a gradient coil arrangement comprising gradient coils for directions of a Cartesian coordinate system to also be used for spatial encoding. For example, it is then possible for a cylindrical coordinate spatial encoding to be generated by the common use of the radial gradient coil and a gradient coil of the gradient coil arrangement generating a linear gradient along the longitudinal direction.

FIG. 1 shows a schematic view of an exemplary embodiment of a magnetic resonance device 1. In an exemplary embodiment, the magnetic resonance device 1 includes a main magnet unit 2, in which a cylindrical patient aperture 3 is embodied. A patient can be moved into the patient aperture 3 using a patient couch 4. In this context, the longitudinal direction 5 of the patient aperture 3 corresponds to the Z direction of a used Cartesian coordinate system 6 in the present case. For each of the directions of the Cartesian coordinate system 6, a gradient coil arrangement 7 arranged surrounding the patient aperture 3 comprises a gradient coil (not shown here), so that a gradient coil is thus provided for the X direction, a gradient coil is provided for the Y direction and a gradient coil is provided for the Z direction.

In an exemplary embodiment, the magnetic resonance device 1 also includes an A20 gradient coil 8, thus a gradient coil is emulated which is able to generate a gradient field which in terms of its field distribution corresponds to the A20 term of the solution of the Laplace equation in spherical coordinates, thus the correspondingly contained spherical area function. The A20 field distribution is in particular characterized in that it has constant values in the X-Y plane, see coordinate system 6, and varies in the Z direction, i.e. longitudinal direction 5. The A20 gradient coil 8, which is only indicated here, may be realized as part of the gradient coil arrangement 7, but may also be present as a separate part or even realized or placed in, at or on the patient couch 4. Since A20 gradient coils of this kind have already been proposed in the prior art, this will not be discussed in further detail here.

In an exemplary embodiment, the magnetic resonance device 1 further includes a radial gradient coil 9, which in the present case is arranged below the patient couch 4 and is accordingly only indicated by a dashed line in FIG. 1. In an exemplary embodiment, the radial gradient coil 9 is embodied as a cylinder coil, the central axis of which runs in parallel with the longitudinal axis of the patient aperture 3, thus lies in the longitudinal direction 5.

FIG. 1 further shows a radio-frequency coil arrangement 11, embodied as a local coil 10 in the present case, with a plurality of coil elements 12, which may be placed on the patient for example. The radio-frequency coil arrangement 11 enables a parallel imaging. The magnetic resonance device 1 may also have further radio-frequency coil arrangements 11, for example connecting to the gradient coil arrangement 7 on the inside and surrounding the patient aperture 3, as a whole-body coil or whole-body coil arrangement (body coil).

To record magnetic resonance data, the various components of the magnetic resonance device 1 are actuated by a controller 13. This is particularly embodied in the present case to also use the radial gradient coil 9 for spatial encoding, in particular in a parallel imaging process. In an exemplary embodiment, the controller 13 includes processor circuitry that is configured to perform one or more operations and/or functions of the controller 13.

In this context, the radial gradient coil 9 can be used together with at least one more of the gradient coils of the magnetic resonance device 1.

Here, a combination with the A20 gradient coil 8 is suitable on the one hand in particular, as the A20 field distribution is constant in the X-Y plane, as has already been mentioned, but varies in the Z direction, and the radial field distribution generated by the radial gradient coil 9 is substantially constant in the Z direction and varies strongly with the distance from the central axis.

Another advantageous combination emerges through the addition of at least the Z gradient coil of the gradient coil arrangement 7, as then at least two basic directions of a cylindrical coordinate system are covered by the radial direction and the Z direction.

Figure 2:
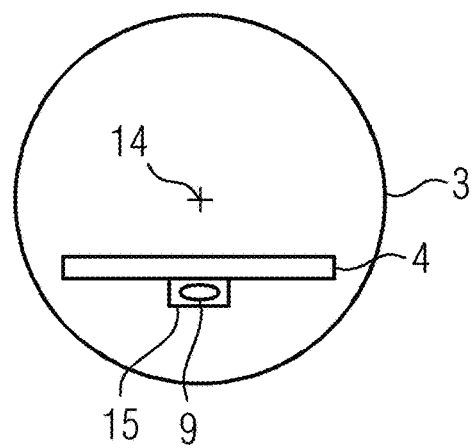
FIG. 2 illustrates shows a cross-section through the patient aperture of the magnetic resonance device according to FIG. 1.

FIG. 2 shows a schematic cross-section through the patient aperture 3. The center 14 characterizing the isocenter, thus the position of the longitudinal axis of the patient aperture 3, is likewise marked. In this exemplary embodiment, it can be seen that the radial gradient coil 9 is fastened below the patient couch 4 arranged in the lower region of the patient aperture 3 with the use of a housing 15. A complete integration into the patient couch 4 is also conceivable in principle.

Figure 3:
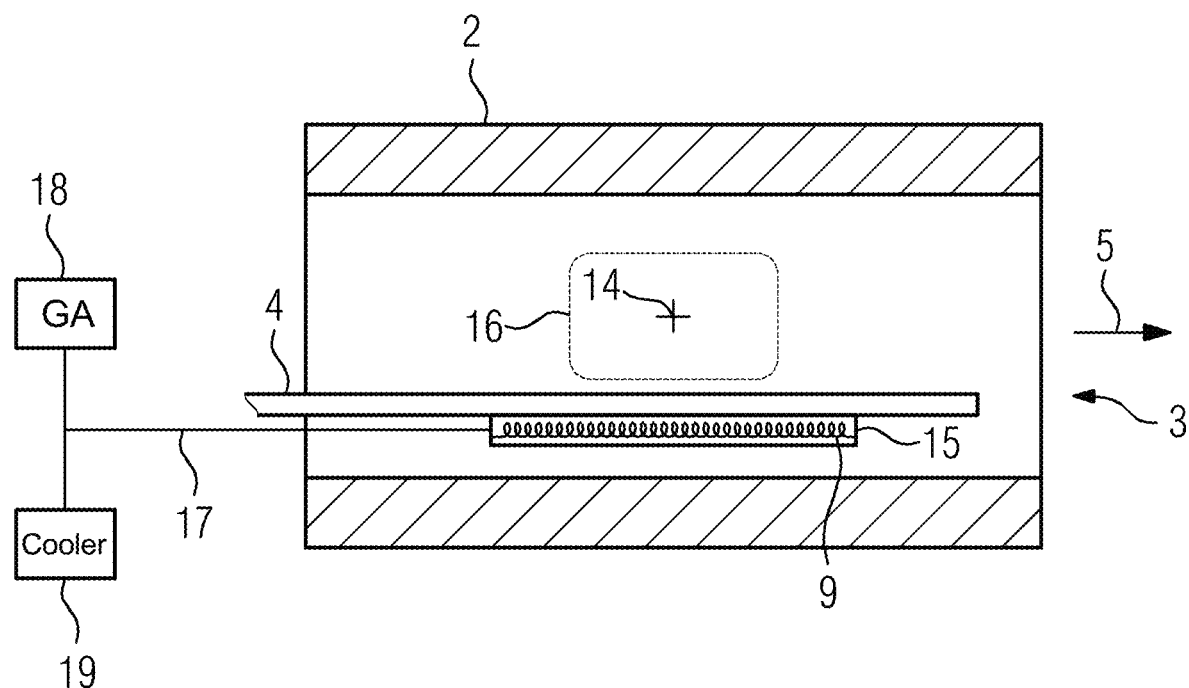
FIG. 3 illustrates a longitudinal section through the patient aperture of the magnetic resonance device according to FIG. 1.

FIG. 3 shows the corresponding longitudinal section 3, in which in addition to the center of the patient aperture 3 the field of view 16, i.e. the homogeneity volume, of the magnetic resonance device 1 is also shown schematically. It can be seen that the length of the radial gradient coil 9 fastened below the patient couch 4 is chosen to be discernibly greater than the extension of the field of view 16 in the longitudinal direction 5, so that even when the patient couch 4 is displaced, for example in order to record another body region of a patient, the gradient field generated by the radial gradient coil 9 remains at least substantially radial.

Figure 4:
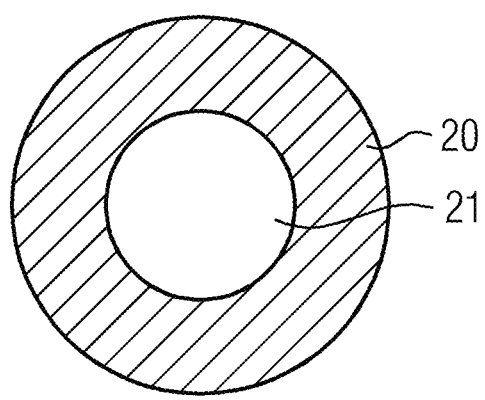
FIG. 4 illustrates a coil conductor according to an exemplary embodiment of the present disclosure.

In FIG. 3, supply lines 17 to the radial gradient coil 9 are also shown, which on the one hand comprise the electrical supply lines 17 coming from an assigned gradient amplifier 18, but on the other hand also comprise cooling lines for a coolant of a cooler 19. In this context, oil can be used as coolant for example, in order to influence the magnetic resonance scan as little as possible. In the present case, however, it is also possible to use water, as the cooler 19, as shown in more detail in FIG. 4, comprises a cooling duct 21 for the cooling medium realized inside the coil conductor 20 of the radial gradient coil 9 consisting of copper in the present case.

Figure 5:
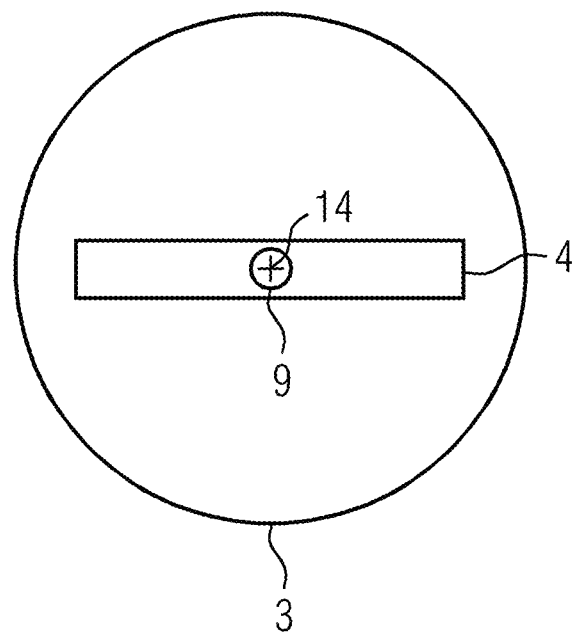
FIG. 5 illustrates a cross-section through the patient aperture in an exemplary embodiment of a magnetic resonance device according to the disclosure.

FIG. 5 shows a cross-section in an exemplary embodiment of a magnetic resonance device 1 according to the disclosure, where the patient aperture 3 has a greater diameter, so that the patient couch 4 can be moved centrally, cf. center point 14, within the patient aperture 3. In this exemplary embodiment, the radial gradient coil 9 is integrated into the patient couch 4, so that its central axis coincides with the longitudinal axis of the patient aperture 3.

Figure 6:
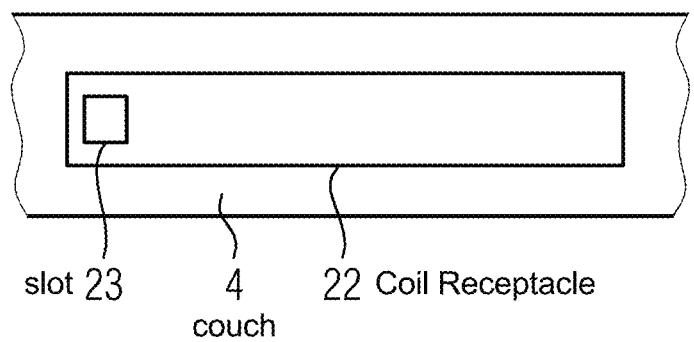
FIG. 6 illustrates a patient couch according to an exemplary embodiment of the present disclosure.

FIG. 6 shows an exemplary embodiment of the patient couch 4. It can be seen that the patient couch 4 in this case has a radial gradient coil receptacle 22, into which the radial gradient coil 9 can be introduced as required, possibly in a housing. A corresponding slot 23 for the supply line 17 is also already provided as part of the radial gradient coil receptacle 22.

Of course, a complete or permanent integration of the radial gradient coil 9 into the patient couch 4 is also conceivable. Further exemplary embodiments may also provide for the gradient coil 9 or a further gradient coil 9 to be realized as a freely positionable part, comparable to the local coil 10.

Although the disclosure has been illustrated and described in greater detail on the basis of the preferred exemplary embodiment, the disclosure is not limited by the disclosed examples and other variations may be derived herefrom by the person skilled in the art without leaving the scope of protection of the disclosure.

Any connection or coupling between functional blocks, devices, components of physical or functional units shown in the drawings and described hereinafter may be implemented by an indirect connection or coupling. A coupling between components may be established over a wired or wireless connection. Functional blocks may be implemented in hardware, software, firmware, or a combination thereof.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A magnetic resonance device comprising:
a main magnet with a cylindrical patient aperture; and
at least one radial gradient coil provided in, and movable within, the patient aperture and configured to generate a gradient field having, at least in regions, a radial gradient field in relation to a central axis of the at least one radial gradient coil that is parallel to a longitudinal axis of the patient aperture, wherein the radial gradient coil is a cylinder coil.

2. A method for recording magnetic resonance data using a magnetic resonance device having a main magnet with a cylindrical patient aperture, comprising:
performing a parallel imaging technique with a radio-frequency coil arrangement having a plurality of radio-frequency coil elements;
moving a radial gradient coil into the cylindrical patient aperture; and
generating a gradient field by the radial gradient coil in the cylindrical patient aperture to generate magnetic resonance signals of at least one of the plurality of radio-frequency coil elements to spatial encode received magnetic resonance signals, wherein the gradient field includes, at least in regions, a radial gradient field in relation to a central axis of the radial gradient coil that is parallel to a longitudinal axis of the cylindrical patient aperture.

3. The magnetic resonance device as claimed in claim 1, wherein a winding radius of the radial gradient coil lies in a range of from 1 cm to 10 cm and/or the radial gradient coil extends in a longitudinal direction along at least a length of a field of view of the magnetic resonance device over a length of at least 50 cm.

4. The magnetic resonance device as claimed in claim 1, wherein the central axis of the radial gradient coil corresponds to the longitudinal axis of the patient aperture or is displaced in relation thereto in a vertical direction perpendicular to the longitudinal axis.

5. The magnetic resonance device as claimed in claim 1, further comprising:
an A20 gradient coil and/or a gradient coil arrangement including gradient coils for directions of a Cartesian coordinate system; and
a controller configured to control the radial gradient coil and the A20 gradient coil and/or the gradient coil arrangement.

6. The magnetic resonance device as claimed in claim 1, further comprising:
a patient couch configured to be movable into and out of the patient aperture, the radial gradient coil being integrated into the patient couch.

7. The magnetic resonance device as claimed in claim 1, further comprising:
a patient couch configured to be movable into and out of the patient aperture, the radial gradient coil being placed on or in the patient couch using a radial gradient coil receptacle, or being arranged below the patient couch.

8. The magnetic resonance device as claimed in claim 1, further comprising an insulator for the radial gradient coil, the insulator being configured to provide thermal and/or electrical insulation with respect to a patient.

9. The magnetic resonance device as claimed in claim 1, further comprising a cooler for the radial gradient coil that is configured to cool the radial gradient coil.

10. The magnetic resonance device as claimed in claim 9, wherein the cooler is configured to operate with a non-water coolant.

11. The magnetic resonance device as claimed in claim 10, wherein the non-water coolant is oil.

12. The magnetic resonance device as claimed in claim 10, wherein the cooler is includes at least one cooling duct in which the coolant runs within a coil conductor of the radial gradient coil.

13. The magnetic resonance device as claimed in claim 1, wherein the magnetic resonance device comprises a radio-frequency coil arrangement configured to perform parallel imaging.

14. The method as claimed in claim 2, wherein the magnetic resonance device further comprises an A20 gradient coil and/or a gradient coil arrangement having gradient coils for directions of a Cartesian coordinate system, the A20 gradient coil and/or the gradient coil arrangement being configured for spatial encoding.

15. The method as claimed in claim 14, further comprising:
generating a cylindrical coordinate spatial encoding using the radial gradient coil; and
generating a liner gradient along a longitudinal direction using a gradient coil of the gradient coil arrangement.

16. The method as claimed in claim 2, wherein the radial gradient coil is a cylinder coil.

17. A non-transitory computer-readable storage medium with an executable program stored thereon, that when executed, instructs a processor to perform the method of claim 2.

18. A computer program product having a computer program which is directly loadable into a memory of a controller of the magnetic resonance tomography system, when executed by the controller, causes the magnetic resonance tomography system to perform the method as claimed in claim 2.

19. The magnetic resonance device as claimed in claim 1, further comprising an A20 gradient coil configured to generate a gradient field having an A20 field distribution.

20. The magnetic resonance device as claimed in claim 1, wherein the at least one radial gradient coil is configured to be movable within the patient aperture to a position in which the central axis of the radial gradient coil corresponds to the longitudinal axis of the patient aperture.

21. The magnetic resonance device as claimed in claim 6, wherein the patient couch is configured to be moveable such that the central axis of the radial gradient coil and the longitudinal axis of the patient aperture pass through the patient couch, the central axis of the radial gradient coil coinciding with the longitudinal axis of the patient aperture.

* * * * *